United States Patent [19]
Dreifus

[11] Patent Number: 5,382,812
[45] Date of Patent: Jan. 17, 1995

[54] DIAMOND AND II-VI HETEROJUNCTION SEMICONDUCTOR LIGHT EMITTING DEVICE

[75] Inventor: David L. Dreifus, Cary, N.C.

[73] Assignee: Kobe Development Corporation, Research Triangle Park, N.C.

[21] Appl. No.: 47,709

[22] Filed: Apr. 14, 1993

[51] Int. Cl.⁶ .................. H01L 33/00; H01L 29/00; H01L 49/00; H01L 29/161
[52] U.S. Cl. ........................ 257/94; 257/12; 257/13; 257/76; 257/77; 257/78; 257/184; 257/200; 257/442; 257/614
[58] Field of Search ............... 257/77, 12, 13, 94, 257/431, 442, 103, 15, 76, 78, 200, 613, 614, 184

[56] References Cited

U.S. PATENT DOCUMENTS

| 4,122,407 | 10/1978 | Van Vechten | 331/94.5 |
|---|---|---|---|
| 4,377,423 | 3/1983 | Anthony | 148/171 |
| 4,685,979 | 8/1987 | Nishizawa | 437/81 |
| 4,819,058 | 4/1989 | Nishizawa | 257/77 |
| 4,875,967 | 10/1989 | Mishima et al. | 156/605 |
| 4,972,250 | 11/1990 | Omori et al. | 257/77 |
| 5,008,891 | 4/1991 | Merita | 372/45 |
| 5,045,894 | 9/1991 | Migita et al. | 257/15 |
| 5,117,267 | 5/1992 | Kimoto et al. | 257/77 |
| 5,173,443 | 12/1992 | Biricik et al. | 437/181 |
| 5,229,028 | 7/1993 | Kobayashi et al. | 257/78 |
| 5,252,840 | 10/1993 | Shiomi et al. | 257/77 |

FOREIGN PATENT DOCUMENTS 2209869  5/1989  United Kingdom ............... 257/94

OTHER PUBLICATIONS

Ren et al., "ZnSe Light-Emitting Diodes", Appl. Phys. Lett. 57(18) 29 Oct. 1990.
Ren et al., "Blue (ZnSe) and Green (ZnSe$_{0.9}$Te$_{0.1}$) Light Emitting Diodes", Journal of Crystal Growth 111 (1991) 829–832, North Holland.
Ren et al., "Substitute Doping of ZnSe Films", Journal of Crystal Growth 111 (1991) 772–775, North Holland.
Park et al., "Noncontact Electrical Characterization of Low-Resistivity P-Type ZnSe:N Grown by Molecular Beam Epitaxy", Appl. Phys. Lett. 59 (15) 7 Oct. 1991.

(List continued on next page.)

Primary Examiner—Andrew J. James
Assistant Examiner—T. M. Arroyo
Attorney, Agent, or Firm—Bell, Seltzer, Park & Gibson

[57] ABSTRACT

A light emitting semiconductor heterojunction includes a first layer of n-type semiconducting material comprising a Group II-VI material, and a second layer of p-type semiconducting diamond on the first layer. Preferably the Group II-VI material includes a Group II material selected from the group consisting of zinc and cadmium, and the Group VI material is selected from the group consisting of sulfur and selenium. The light emitting heterojunction will produce light having a wavelength in the range of about 440–550 nanometers, depending on the composition and the temperature of operation. One embodiment of the device is a surface emitting device and includes a contact layer on the diamond layer having a predetermined shape, such as a ring, overlying only a portion of the diamond layer for permitting surface emission of light from diamond layer. The light emitting heterojunction may also be configured as an edge emitting device, such as a laser, wherein the first and second layers both have opposing cleaved edge faces transverse to the heterojunction to thereby define a Fabry-Perot etalon therebetween. A contact stripe is preferably provided on the second layer of the laser. To further define the edge emitting region of the heterojunction, two laterally spaced apart and lengthwise extending insulating layers may be formed between the contact stripe and the diamond. Methods for fabricating the devices are also disclosed.

29 Claims, 2 Drawing Sheets

OTHER PUBLICATIONS

Jeon et al., "ZnSe Based Multilayer PN Junctions as Efficient Light Emitting Diodes for Display Applications", Appl. Phys. Lett. 60(7), 17 Feb. 1992.

Jeon et al., "Blue and Green Diode Lasers in ZnSe-Based Quantum Wells", Appl. Phys. Lett. 60 (17), 17 Apr. 1992.

Xie et al., "Room Temperature Blue Light Emitting P-N Diodes from Zn(S,Se)-Based Multiple Quantum Well Structures", Appl. Phys. Lett. 60 (17), 20 Apr. 1992.

Scranton et al., "Highly Electronegative Contacts to Compound Semiconductors", J. Vac. Sci. Technol., vol. 14, No. 4, Jul./Aug. 1977.

Xie et al., "Blue/Green PN Junctions Electroluminescence from ZnSe-Based Multiple Quantum-Well Structures", Appl. Phys. Lett. 60 (4), 27 Jan. 1992.

Schubert et al., "Elimination of Heterojunction Band Discontinuities by Modulation Doping", Appl. Phys. Lett. 60 (4), 27 Jan. 1992.

Best et al., "Lattice-Matched Heterostructures as Schottky Barriers: HgSe/CdSe", J. Vac. Sci. Technol. 16(5), Sep./Oct. 1979.

Jeon et al., "Blue-Green Injection Laser Diodes in (Zn,Cd)Se/ZnSe Quantum Wells", Appl. Phys. Lett. 59(27), 30 Dec. 1991.

Haase et al., "Blue-Green Laser Diodes", Appl. Phys. Lett. 59 (11), 9 Sep. 1991.

DIAMOND AND II-VI HETEROJUNCTION SEMICONDUCTOR LIGHT EMITTING DEVICE

FIELD OF THE INVENTION

This invention relates to the field of semiconductor devices, and, more particularly, to a light emitting device for producing blue or blue-green light and associated fabrication methods for the device.

BACKGROUND OF THE INVENTION

Semiconductor light emitting devices are available for emitting light at predetermined wavelengths. In particular, blue and blue-green wavelengths are of special interest for their use in full-color displays, as read-write laser sources for high density optical information storage, and as sources for undersea optical communications.

Extensive research has been devoted to semiconductor light emitting devices including Group II-VI materials to produce blue light. The Group II-VI compounds, ZnSe and ZnSSe, in particular, have received considerable attention as materials for fabricating a blue light emitting device. In addition, a blue light emitting device may also be fabricated from the solid solutions of (Zn,Cd)(Se,S) and, since these materials form solid solutions for varying compositions, a wide variation of optical emissions wavelengths could be achieved.

An article by Ren et al., for example, entitled *ZnSe Light-Emitting Diodes*, appearing in Appl. Phys. Lett. 57 (18) Oct. 29, 1990, discloses a ZnSe p-n light-emitting junction including chlorine as the n-type dopant and lithium as the p-type dopant. U.S. Pat. No. 5,045,894 to Migita et al. entitled *Compound Semiconductor Light Emitting Device* discloses a strained layer superlattice light emitting device including ZnSe as one of the layer materials. Another article by Ren et al., entitled *Blue (ZnSe) and Green ($ZnSe_{0.9}Te_{0.1}$) Light Emitting Diodes*, appearing in the Journal of Crystal Growth, 111, pp. 829–832, (1991), discloses both a ZnSe p-n junction and a double heterojunction ZnSeTe device. See also, for example. Jeon et al., *"ZnSe Based Multilayer PN Junctions as Efficient Light Emitting Diodes for Display Applications"*, Appl. Phys. Lett. 60 (7), Feb. 17 1992; Haase et al , *"Blue-Green Laser Diodes"*, Appl. Phys. Lett. 59 (11), Sept. 9, 1991; Xie et al., *"Blue/Green PN Junctions Electroluminescence from ZnSe-Based Multiple Quantum-Well Structures"*, Appl. Phys. Lett. 60 (4), Jan. 27, 1992; Xie et al., *"Room Temperature Blue Light Emitting P-N Diodes from Zn(S,Se)-Based Multiple Quantum Well Structures"*, Appl. Phys. Lett. 60 (17), Apr. 20, 1992; and Jeon et al., *"Blue-Green Injection Laser Diodes in (Zn,Cd)Se/ZnSe Quantum Wells"*, Appl. Phys. Lett. 59 (27), Dec. 30, 1991.

Ideally, a ZnSe or ZnSSE p-n junction would satisfy most of the blue or blue-green optical emission requirements. Unfortunately such light emitters have experienced poor controllability, and/or low output power and low luminescence efficiencies. There continue to be materials limitations on the controllability of substitutional doping of ZnSe or ZnSSE and other Group II-VI materials in general. Moreover, p-type doping of ZnSe or ZnSSE is difficult and often not reproducible. In addition, good ohmic contacts to such p-type materials may also be difficult.

Other materials have also been explored for fabricating a blue light emitting device. For example, U.S. Pat. No. 5,117,267 to Kimoto et al. entitled *Semiconductor Heterojunction Structure* discloses a light emitting device including two layers of p-doped diamond with an intervening layer of n-type cubic Boron Nitride (cBN). While diamond is a preferred material for many semiconductor applications; unfortunately, diamond is an indirect bandgap semiconductor and thus will have poor optical emission efficiency. Moreover, n-type doping of diamond for a heterojunction device is not presently readily or reproducibly achievable.

SUMMARY OF THE INVENTION

It is therefore an object of the present invention to provide a light emitting semiconductor device and associated fabrication method for producing blue or blue-green light.

It is another object of the invention to provide a light emitting semiconductor device and associated fabrication method incorporating materials that may be readily and reproducibly doped to form the device, such as including Group II-VI materials without requiring p-type doping of such materials.

These and other objects, advantages and features of the present invention are provided by a light emitting device including a first layer comprising an n-type semiconducting Group II-VI material, and a second layer comprising p-type semiconducting diamond on the first layer. Preferably the Group II-VI material is $ZnS_XSe_{1-X}$, where $0 \leq X \leq 1$, or $Zn_YCd_{1-Y}S_XSe_{1-X}$, where $0 \leq X \leq 1$ and $0 \leq Y \leq 1$. In other words, the Group II material is preferably selected from the group consisting of zinc and cadmium, and the Group VI material is preferably selected from the group consisting of sulfur and selenium.

The two layers thus form a light emitting heterojunction which will produce light having a wavelength in the range of about 440–550 nanometers, depending on the composition and the temperature of operation. Accordingly, the present invention overcomes the difficulties in the substitutional doping of $ZnS_XSe_{1-X}$, for example, with a p-type dopant and also overcomes the limitation of n-type doping of diamond, as well as the poor optical emission efficiency of diamond. The present invention advantageously combines a readily p-doped material, that is, diamond, with a readily n-doped material, that is, a Group II-VI material.

As would be readily understood by those skilled in the art, diamond is a good optical window. Thus, the light emitting heterojunction preferably includes an electrically conductive contact layer on the second diamond layer having a predetermined shape, such as a ring, overlying only a portion of the second layer for permitting surface emission of light from the second diamond layer. In this configuration, the device is a surface emitting device.

The light emitting device may also be configured as an edge emitting diode, or laser, as would be readily understood by those skilled in the art. In the laser edge emitting configuration, the first and second layers both have opposing cleaved edge faces transverse to the heterojunction to thereby define a Fabry-Perot etalon therebetween. A contact stripe is preferably provided on the second layer. To further define the edge emitting region of the heterojunction, two laterally spaced apart and lengthwise extending insulating layers may be formed between the contact stripe and the diamond.

For a $ZnS_XSe_{1-X}$ device, for example, the first layer of $ZnS_XSe_{1-X}$ preferably has a thickness in the range of about 0.5 to 100 μm, and more preferably, about 0.5 to 10 μm. The diamond layer preferably has a thickness in the range of about 0.5 to 100 μm, and more preferably, about 0.5 to 20 μm. The ZnS$_X$Se$_{1-X}$ layer is also preferably doped with an n-type dopant, such as chlorine, to a level in the range of about $10^{16}$ to $10^{20}$ cm$^{-3}$, and more preferably, in the range of about $10^{16}$ to $10^{18}$ cm$^{-3}$. The diamond layer is preferably p-doped, such as with boron, to a level in the range of about $10^{16}$ to $10^{21}$ cm$^{-3}$, and more preferably, about $10^{18}$ to $10^{19}$ cm$^{-3}$. Thus, the light emitting device according to the invention incorporates an n-type Group II-VI material, such as ZnS$_X$Se$_{1-X}$, for example, which is readily fabricated such as by chlorine doping, and p-type diamond, which is readily fabricated using boron as the dopant to thereby overcome the difficulties of doping ZnS$_X$Se$_{1-X}$ with a p-type dopant and of doping diamond with an n-type dopant.

The light emitting device is preferably fabricated on an electrically conductive substrate such as silicon-doped gallium arsenide. In addition, a metal contact layer is preferably provided on the backside of the substrate.

The method for making the light emitting device includes forming a first layer comprising a semiconducting Group II-VI material as described above, and forming a second layer of semiconducting diamond on the first layer. The first layer is preferably an n-type material wherein the Group II material is selected from the group consisting of zinc and cadmium, and the Group VI material is selected from the group consisting of sulfur and selenium. The diamond layer is preferably p-type diamond, both of which may readily fabricated as would be understood by those skilled in the art.

DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiment set forth herein; rather, applicant provides this embodiment so that this disclosure will be thorough and complete, and will fully convey the scope of the invention to those skilled in the art. Like numbers refer to like elements throughout. The thickness of layers and regions are exaggerated for clarity.

Figure 1:
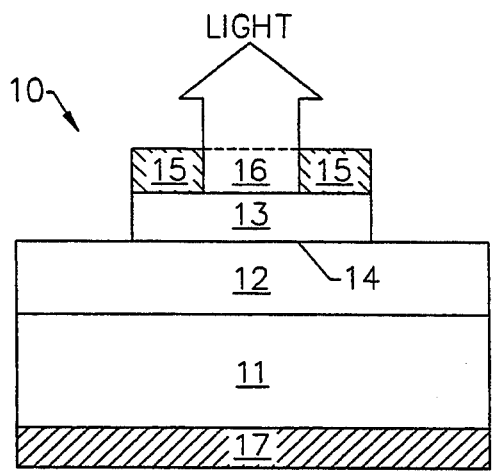
FIG. 1 is a cross-sectional side view of a surface emitting embodiment of a light emitting device according to the present invention.

Referring now to FIG. 1, a first embodiment of the light emitting device 10 according to the invention is explained. The device 10 includes a substrate 11 onto which a first layer 12 comprising a Group II-VI semiconductor material is deposited. The first layer 12 preferably has a thickness in the range of about 0.5 to 100 μm, and more preferably, about 0.5 to 10 μm. The Group II-VI material is preferably a solid solution of ZnS$_X$Se$_{1-X}$, where $0 \leq X \leq 1$, or Zn$_Y$Cd$_{1-Y}$S$_X$Se$_{1-X}$, where $0 \leq X \leq 1$ and $0 \leq Y \leq 1$. In other words, the Group II material is preferably selected from the group consisting of zinc and cadmium, and the Group VI material is preferably selected from the group consisting of sulfur and selenium. The Group II-VI material may be readily deposited using conventional techniques as would be appreciated by those skilled in the art.

A second layer 13 of polycrystalline diamond is deposited onto the first layer 12 of the Group II-VI material. The second diamond layer 13 is preferably 0.5 to 100 μm in thickness, and, more preferably, about 0.5 to 10 μm in thickness. The first layer 12 is preferably n-type, while the second layer 13 is preferably p-type. Accordingly, the light emitting device 10 may preferably include p-type diamond and an n-type Group II-VI material both of which are readily and reproducibly fabricated. In addition, the first layer 12 is preferably n-doped, such as with chlorine, to a level of about $10^{15}$ to $10^{20}$ cm$^{-3}$, and, more preferably about $10^{16}$ to $10^{18}$ cm$^{-3}$. The second diamond layer 13 is preferably p-doped, such as using boron, to a level of our about $10^{16}$ to $10^{21}$ cm$^{-3}$, and more preferably, about $10^{16}$ to $10^{19}$ cm$^{-3}$.

The first and second layers 12 and 13, respectively, define a light emitting heterojunction 14 therebetween. The heterojunction 14 formed by ZnS$_X$Se$_{1-X}$, or Zn$_Y$Cd$_{1-Y}$S$_X$Se$_{1-X}$, for example, and diamond, produces blue or blue-green light in the wavelength range of from about 440–550 nanometers, depending on the composition and the temperature of operation.

An electrically conducting contact layer, such as a metal contact layer 15, is preferably provided on the second diamond layer 13 for forming an ohmic contact to the second layer. The metal contact layer 15 is preferably provided by a gold/titanium bilayer wherein the titanium is adjacent the diamond layer 13 and the gold is on the titanium opposite the diamond layer. Alternately, a titanium carbide/gold bilayer may also be provided.

The metal contact layer 15 preferably covers only a predetermined portion of the second layer 13 thereby permitting light generated at the heterojunction 14 between the first and second layers 12 and 13, respectively, to pass through the second layer of transparent diamond and out from the surface of the second layer. As illustrated, the metal contact layer 15 may be in the shape of a ring to thereby define a central opening 16 through which the generated light may pass thereby defining a surface emitting device.

The substrate 11 upon which the first layer of Group II-VI material is formed is preferably electrically conductive. A preferred material for the substrate 11 is silicon-doped gallium arsenide. A metal contact layer 17 is also preferably formed on the backside of the substrate 11. The metal contact layer 17 may be formed of gold/germanium, or indium.

Figure 2:
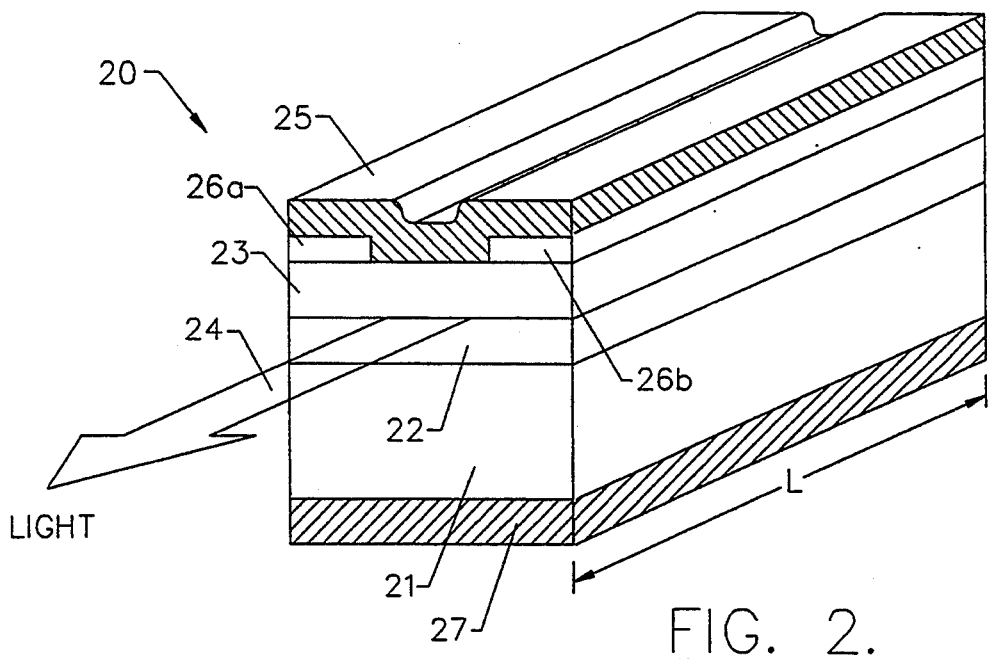
FIG. 2 is a front perspective view of an edge emitting embodiment of a light emitting device according to the present invention.

A second embodiment of an edge emitting device 20 according to the invention is shown in FIG. 2. The embodiment includes a substrate 21 onto which is deposited a first layer 22 comprising a Group II-VI semiconducting material and preferably having n-type conductivity. A second layer 23 of polycrystalline diamond preferably having p-type conductivity is deposited onto the first layer 22 thereby forming a light emitting heterojunction 24 therewith.

As shown in the illustrated embodiment of FIG. 2, the edge emitting device 20 includes an electrically conductive layer, such as a metal contact layer 25 overlying a lengthwise extending portion of the second layer 23 of diamond. A pair of laterally spaced apart lengthwise extending insulating layers 26a, 26b may be formed to more narrowly define the light emitting heterojunction 24 as shown. The insulating layers 26a, 26b may be SiO$_2$ or insulating diamond, for example.

The edge emitting device 20 may be either an edge emitting diode or an edge emitting laser. For an edge emitting laser, the device 20 has opposing cleaved end faces separated by length L to define a Fabry-Perot etalon therebetween. As would be readily understood by those skilled in the art, the partially reflecting cleaved end faces provide optical feedback that causes one or more longitudinal optical modes. The standing wave produced within the laser light emitting device 20 has an integral number (m) of half-wavelengths between the opposing end faces as defined by the relationship:

$$m = \frac{2Ln}{\lambda_o}$$

where L is the length between end faces, n is the index of refraction of the laser material, and $\lambda_o$ is the vacuum wavelength of the emitted light. See, for example, Hunsperger, *Integrated Optics: Theory and Technology*, Second Edition, Published by Springer-Verlag, Chapter 11, Semiconductor Lasers, pp. 177–237, (1985).

Figure 3:
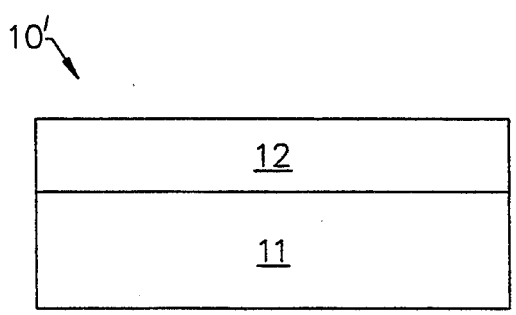
FIGS. 3 and 4 are side cross-sectional views illustrating intermediate stages in fabricating the surface emitting embodiment of the light emitting device as shown in FIG. 1.
Figure 4:
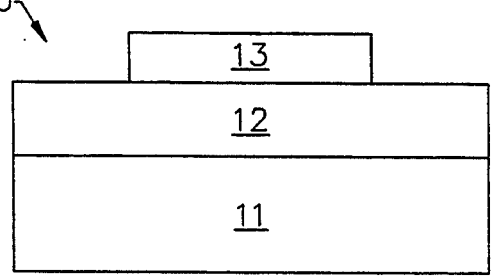

Referring now to FIGS. 1, 3 and 4, the method of fabricating the surface light emitting device 10 according to the invention is explained. A first layer 12 of semiconductor comprising a Group II-VI material is deposited onto a substrate 11, such as an electrically conductive substrate (FIG. 3). As described above, the first layer 12 is preferably n-type and may be deposited using conventional deposition techniques as would be readily understood by those skilled in the art.

As shown in FIG. 4, a second layer 13 of p-type semiconducting diamond is formed onto the first layer 12, also by any of a number of conventional deposition techniques as would be readily understood by those skilled in the art. A metal ring-shaped contact layer 15 (FIG. 1) may then be formed by conventional photolithographic and deposition techniques. A metal contact layer 17 may also be formed on the backside of the electrically conductive substrate 11. As would be readily understood by those skilled in the art, a layer of diamond may alternately be first deposited onto a suitable substrate, then a layer of Group II-VI material may be deposited onto the diamond layer.

Figure 5:
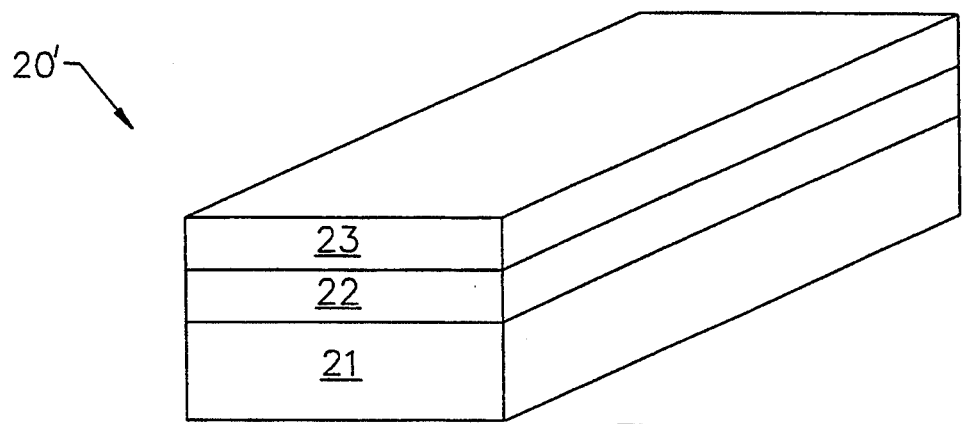
FIGS. 5 and 6 are front perspective views illustrating intermediate stages in fabricating the edge emitting embodiment of the light emitting device as shown in FIG. 2.
Figure 6:
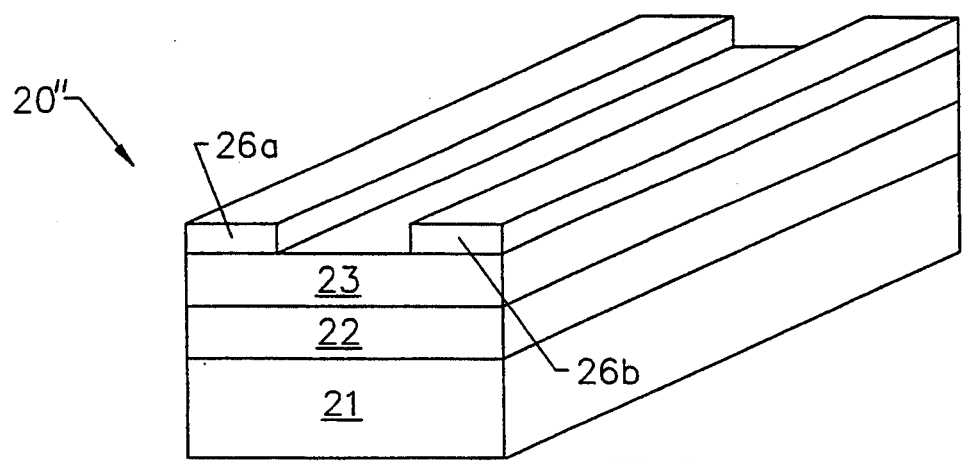

Referring now to FIGS. 2, 5 and 6, the method for fabricating the edge emitting device 20 according to the invention are best understood. A layer of a Group II-VI material 22 is deposited onto an electrically conductive substrate 21. A layer of p-type diamond 23 is then deposited and the structure is cleaved to define a Fabry-Perot etalon between opposing cleaved end faces (FIG. 5) to form an edge emitting laser device. A back contact 27 and spaced apart lengthwise extending insulating layers 26a, 26b may then be deposited onto the diamond layer 23 and a metal stripe 25 deposited thereon to form the light emitting device as shown in FIG. 2. As would be readily understood by those skilled in the art, a layer of diamond may alternately be first deposited onto a suitable substrate, then a layer of Group II-VI material may be deposited onto the diamond layer.

While heterojunction devices have been described above, those skilled in the art will readily recognize that other structures, including double heterojunction devices and superlattice devices may also be fabricated according to the present invention. Thus, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A light emitting semiconductor device comprising:
   a first layer comprising an n-type semiconducting Group II-VI material; and
   a second layer on said first layer, said second layer comprising p-type semiconducting diamond thereby forming a light emitting heterojunction with said first layer.

2. A light emitting semiconductor device according to claim 1 further comprising an electrically conductive contact layer on said second layer opposite said first layer, wherein said contact layer has a predetermined shape overlying only a portion of said second layer for permitting surface emission of light from said second layer.

3. A light emitting semiconductor device according to claim 2 wherein said predetermined shape of said contact layer is ring-like defining a central opening therethrough.

4. A light emitting semiconductor device according to claim 1 further comprising an electrically conductive contact layer on said second layer opposite said first layer, and wherein said contact layer has a stripe shape to thereby define an edge emitting device.

5. A light emitting semiconductor device according to claim 4 wherein said first and second layers both have opposing cleaved edge surfaces transverse to the heterojunction to thereby define a Fabry-Perot etalon therebetween for laser light emission from one of said cleaved edge surfaces.

6. A light emitting semiconductor device according to claim 4 wherein said contact layer has a pair of lengthwise extending spaced apart side portions, and further comprising respective insulating layers positioned between said pair of side portions and respective underlying portions of said semiconducting diamond layer.

7. A light emitting semiconductor device according to claim 1 wherein said first layer has a thickness in the range of about 0.5 to 100 μm.

8. A light emitting semiconductor device according to claim 1 wherein said second layer has a thickness in the range of about 0.5 to 100 μm.

9. A light emitting semiconductor device according to claim 1 wherein said first layer has a dopant level in the range of about $10^{16}$ to $10^{20}$ cm$^{-3}$.

10. A light emitting semiconductor device according to claim 1 wherein said second layer has a dopant level in the range of about $10^{16}$ to $10^{21}$ cm$^{-3}$.

11. A light emitting semiconductor device according to claim 1 further comprising an electrically conductive substrate on said first layer opposite said second layer.

12. A light emitting semiconductor device according to claim 11 wherein said electrically conductive substrate is silicon-doped gallium arsenide.

13. A light emitting semiconductor device according to claim 11 further comprising a contact layer on said electrically conductive substrate opposite said first layer.

14. A light emitting semiconductor device according to claim 1 wherein said second layer comprises polycrystalline diamond.

15. A light emitting semiconductor device comprising:
- a first layer comprising an n-type semiconducting Group II-VI material, the Group II material selected from the group consisting of zinc and cadmium, and the Group VI material selected from the group consisting of sulfur and selenium; and
- a second layer on said first layer, said second layer comprising p-type semiconducting diamond thereby forming a light emitting heterojunction with said first layer.

16. A light emitting semiconductor device according to claim 15 further comprising an electrically conductive contact layer on said second layer opposite said first layer, wherein said contact layer has a predetermined shape overlying only a portion of said second layer for permitting surface emission of light from said second layer.

17. A light emitting semiconductor device according to claim 16 wherein said predetermined shape of said contact layer is ring-like defining a central opening therethrough.

18. A light emitting semiconductor device according to claim 15 further comprising an electrically conductive contact layer on said second layer opposite said first layer, and wherein said contact layer has a stripe shape thereby defining an edge emitting device.

19. A light emitting semiconductor device according to claim 18 wherein said first and second layers both have opposing cleaved edge surfaces transverse to the heterojunction to thereby define a Fabry-Perot etalon therebetween for laser light emission from one of said cleaved edge surfaces.

20. A light emitting semiconductor device according to claim 18 wherein said contact layer has a pair of lengthwise extending spaced apart side portions, and further comprising respective insulating layers positioned between said pair of side portions and respective underlying portions of said semiconducting diamond layer.

21. A light emitting semiconductor device according to claim 15 wherein said first layer has a thickness in the range of about 0.5 to 100 $\mu$m.

22. A light emitting semiconductor device according to claim 15 wherein said second layer has a thickness in the range of about 0.5 to 100 $\mu$m.

23. A light emitting semiconductor device according to claim 15 further comprising an electrically conductive substrate on said first layer opposite said second layer, and a metal contact layer on said electrically conductive substrate opposite said first layer.

24. A light emitting semiconductor device according to claim 23 wherein said electrically conductive substrate is silicon-doped gallium arsenide.

25. A light emitting semiconductor device comprising:
- a first layer comprising a Group II-VI semiconducting material, said first layer having a first conductivity type; and
- a second layer comprising semiconducting diamond on said first layer, said second layer having a second conductivity type thereby forming a light emitting heterojunction with said first layer.

26. A light emitting semiconductor device according to claim 25 wherein said first layer is doped with an n-type dopant to a level in the range of about $10^{16}$ to $10^{20}$ cm$^{-3}$.

27. A light emitting semiconductor device according to claim 25 wherein said second layer is doped with a p-type dopant to a level in the range of about $10^{16}$ to $10^{21}$ cm$^{-3}$.

28. A light emitting semiconductor device according to claim 25 wherein said first layer has a thickness in the range of about 0.5 to 100 $\mu$m.

29. A light emitting semiconductor device according to claim 25 wherein said second layer has a thickness in the range of about 0.5 to 100 $\mu$m.

* * * * *